United States Patent [19]

Pavlin

[11] Patent Number: 4,954,728

[45] Date of Patent: Sep. 4, 1990

[54] STABILIZED GENERATOR FOR SUPPLYING A THRESHOLD VOLTAGE TO A MOS TRANSISTOR

[75] Inventor: Antoine Pavlin, Aix En Provence, France

[73] Assignee: SGS-Thomson Microelectronics S.A., Gentilly, France

[21] Appl. No.: 318,870

[22] Filed: Mar. 6, 1989

[30] Foreign Application Priority Data

Mar. 9, 1988 [FR] France .............................. 88/03751

[51] Int. Cl.[5] .......................... H03K 3/01; H03F 3/45

[52] U.S. Cl. .................................. 307/296.8; 307/497; 307/491; 307/296.5; 330/261

[58] Field of Search ............... 307/491, 443, 497, 360, 307/296.7, 296.8, 296.5; 330/261, 296

[56] References Cited

U.S. PATENT DOCUMENTS

| | | | |
|---|---|---|---|
| 3,546,481 | 12/1970 | Talley | 307/360 |
| 4,342,004 | 7/1982 | Iida et al. | 330/253 |
| 4,427,903 | 1/1984 | Sugimoto | 307/355 |
| 4,553,098 | 11/1985 | Yoh et al. | 324/433 |
| 4,563,595 | 1/1986 | Bose | 307/296.8 |
| 4,584,492 | 4/1986 | Sharp | 307/443 |
| 4,724,344 | 2/1988 | Watanabe | 307/497 |

FOREIGN PATENT DOCUMENTS

| | | |
|---|---|---|
| 0019279 | 11/1980 | European Pat. Off. . |
| 0045841 | 2/1982 | European Pat. Off. . |
| 58-221521 | of 1982 | Japan . |
| 2016801 | 9/1979 | United Kingdom . |

*Primary Examiner*—Timothy P. Callahan
*Attorney, Agent, or Firm*—Lowe, Price, LeBlanc, Becker & Shur

[57] ABSTRACT

A stabilized bias generator supplies a threshold voltage to a MOS transistor fabricated on a common integrated circuit device. The bias generator automatically compensates for changes in the threshold voltage of the MOS transistor caused by varying operating parameters, changes in temperature or manufacturing parameters. A first comparator of a matched pair of comparators receives a biasing voltage and includes first and second inputs respectively receiving a variable voltage and a reference voltage. The second comparator of the matched pair has first and second inputs interconnected to receive the reference voltage. One of a pair of matched inverters has in input receiving an output from the first comparator and supplies at an output thereof the threshold voltage and the MOS transistor. The other of the matched pair of inverters is connected to receive an output from the second comparator. A third inverter is connected to receive an output from the second inverter and output the biasing voltage to the MOS transistor and to the first and second comparators. The third inverter is selected to have a threshold voltage substantially equal to the threshold voltage of the MOS transistor.

12 Claims, 2 Drawing Sheets

STABILIZED GENERATOR FOR SUPPLYING A THRESHOLD VOLTAGE TO A MOS TRANSISTOR

BACKGROUND OF THE INVENTION

The instant invention relates to the field of MOS (metal-oxide-semiconductor) transistors.

In such circuits, it is often necessary to compare a variable voltage signal $V_{in}$ with a reference voltage $V_{REF}$.

FIG. 1 schematically shows such a comparator used in the prior art. This comparator receives on its inputs the two voltages to be compared, the output stage being constituted by an inverter 2. Said inverter supplies a voltage equal to the threshold voltage of a MOS transistor M, at the time when $V_{in}=V_{REF}$, when the reference voltage and the biasing voltage of the comparator 1 are properly selected.

A conventional circuit for supplying a biasing voltage for the comparator 1 comprises two MOS transistors M1 and M2 in series between a power supply source $V_{DD}$ and the ground. The transistor M1 is a MOS depletion transistor and the transistor M2 is a MOS enhancement transistor. The transistor M1 functions as a load and its gate and source are interconnected while the drain and the gate of the MOS transistor M2 are also interconnected. The biasing voltage of the comparator 1 is drawn at the interconnection point of transistors M1 and M2.

It will be noted from what has been explained and from the hereinunder description of the instant invention that what is referred to here as an inverter is a circuit supplying a high output voltage when its input is at a low level, and conversely, and not a circuit inverting the polarity of the input voltages.

FIG. 2 shows in more detail an embodiment of the circuit of FIG. 1 and more particularly of the comparator 1. This comparator comprises two enhancement MOS transistors M3 and M4, the gates of which are connected respectively to $V_{in}$ and to a reference voltage $V_{REF}$. The drain of transistor M3 is connected to the power supply voltage $V_{DD}$, the drain of the transistor M4 is connected to this same voltage through a depletion MOS transistor acting a charge M5, the gate of which is connected to the source. The sources of the transistors M3 and M4 are interconnected and are grounded through a biasing MOS transistor of the enhancement type. The output stage, or offset stage, of the comparator comprises enhancement MOS transistors M7 and M8 connected in series, the gate of transistor M7 being connected to the gate of transistor M5 and the gate of transistor M8 being connected to the gates of transistors M2 and M6.

The biasing voltage set by the transistors M1 and M2 functions to set the current level in the transistors M6 and M8. The size of these transistors with respect to the other transistors of the comparator and of the offset circuit is chosen in order to establish at the output of the inverter 2 a voltage equal to the threshold voltage of an N-channel enhancement transistor for a given combination of operation temperature and manufacturing parameters when $V_{in}=V_{REF}$. However, if one of those conditions varies, the output voltage of the inverter will no longer be equal to the threshold voltage of the MOS transistor. Thus, if $V_x$ is the voltage of the common drains of the transistors M3 and M4, and $V_y$ the voltage at the gate of the transistor M7, if the biasing voltage increases, the transistors M6 and M8 will become more conductive and the voltage at the nodes $V_x$ and $V_y$ will decrease. As a result, a decrease of the inverter input voltage and an increase of its output voltage will occur. This voltage will therefore be no longer equal to the threshold voltage of an N-channel MOS transistor at the time when $V_{in}=V_{REF}$. Conversely, if the biasing voltage at the gate of the transistors M6 and M8 decreases, the output voltage of the inverter 2 will decrease.

One object of the instant invention is to provide for a circuit permitting to obtain a voltage corresponding in all cases to the threshold voltage of a MOS transistor, even when the operative parameters, temperature or manufacturing circumstances, vary.

SUMMARY OF THE INVENTION

In order to achieve this purpose, the instant invention provides to use values of the comparator biasing voltage in a determined way.

Thus, the instant invention provides for a stabilized generator integrated in a MOS integrated circuit for supplying a biasing voltage to a first comparator connected to a first inverter designed to supply a voltage equal to a MOS transistor threshold voltage when said two inputs have the same voltage. This generator comprises a second comparator and a second inverter respectively identical to the first ones, and a third inverter receiving the output of the second one, and the output of which is connected to the biasing inputs of the comparators, this third inverter being so designed that its threshold voltage is slightly higher than the threshold voltage of a MOS transistor.

According to an embodiment of the instant invention, the second comparator comprises two comparison MOS transistors, the gates of which are interconnected and receive the reference voltage $V_{REF}$ and the sources of which are grounded through a biasing transistor which receives the output of the third inverter on its gate.

According to an embodiment of the instant invention, the third inverter comprises a depletion transistor in series with an enhancement transistor, said enhancement transistor being identical to the transistor to which it is desired to supply a threshold biasing voltage, the depletion transistor having a high resistance at the ON-state with respect to that of the enhancement transistor at the neighbourhood of its conduction threshold.

BRIEF DESCRIPTION OF THE DRAWINGS

Those objects, features, advantages and others of the instant invention will clearly appear from the following detailed description of preferred embodiments, in connection with the attached drawings, wherein.

Figure 1:
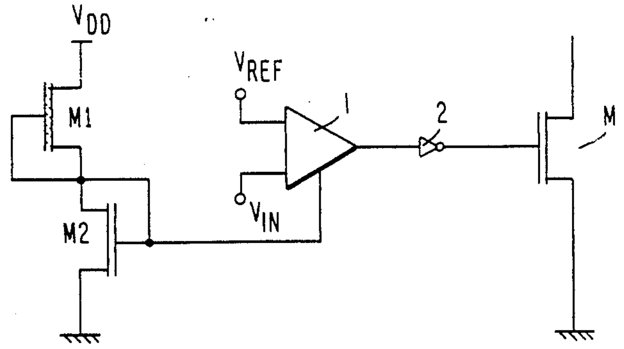
FIG. 1 is a block diagram of a comparator according to the prior art.

In the figures, identical or similar components are labelled with the same reference numerals. It will be noted that the enhancement MOS transistors (normally in the OFF-state) are shown with a gate line separated by a white region from a line symbolizing the substrate while the depletion MOS transistors (normally in the ON-state) are shown with a gate line separated by a hatched region from a line symbolizing the substrate.

DETAILED DESCRIPTION OF THE INVENTION

Figure 3:
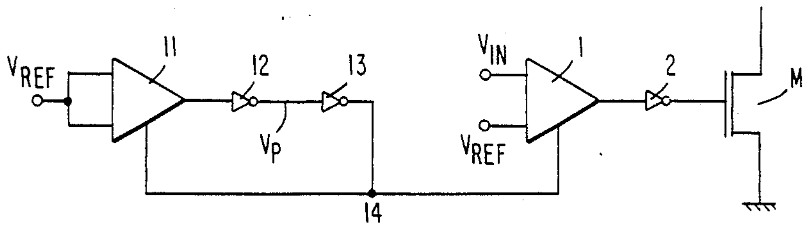
FIG. 3 is a block diagram of a biasing current according to the instant invention.

As shown in FIG. 3, a circuit according to the instant invention is used for biasing the comparator 1 of the conventional circuit illustrated in FIG. 1. The biasing circuit comprises a comparator 11 and an inverter 12 connected in the same way as the comparator 1 and the inverter 2 of FIG. 1, except that the two inputs of comparator 11 are interconnected to the reference voltage $V_{REF}$. The output of inverter 12 is connected to the input of an inverter 13, the output 14 of which supplies the biasing voltage of the comparators 11 and 1. The circuit is so designed that the inverter 12 usually supplies a voltage almost equal to the threshold of inverter 13 which is in turn so designed that its voltage threshold is substantially equal to the threshold of a MOS transistor. Since the input voltage of inverter 13 is substantially equal to and slightly higher than the conduction threshold of this inverter, a slight current flows in this inverter and establishes a balance biasing voltage for the voltage comparator.

Figure 2:
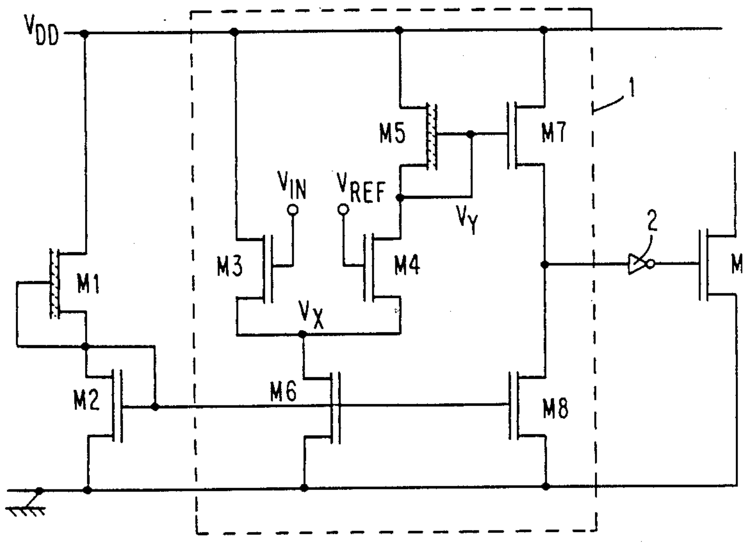
FIG. 2 shows in more detail the circuit according to the prior art.
Figure 4:
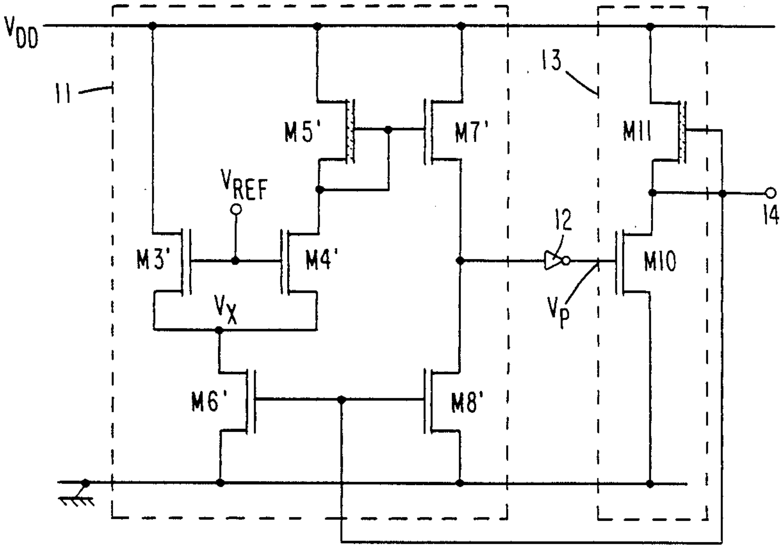
FIG. 4 shows in more detail a circuit according to the instant invention.

The operation of this circuit will be better understood in relation with the description of an examplary implementation illustrated in FIG. 4, where the comparator 11 and the inverters 12 and 13 are shown again. The comparator 11 is identical to the comparator 1 illustrated in detail in FIG. 2. The MOS transistors constituting this comparator are designated in FIG. 4 by the same references as those of FIG. 2 written with a prime mark. The output inverter 13 comprises an enhancement MOS transistor M10, the gate of which receives the output of inverter 12 and which is connected to the voltage $V_{DD}$ through a charge constituted by a depletion MOS transistor M11. The gate of the transistor M11 is connected to the connection 14 of transistors M11 and M10 which also serves as an output terminal connected to the common connection of the transistors M6' and M8' which corresponds to the biasing input of comparator 11. Similarly, terminal 14 is connected to the biasing terminal of the comparator 1. The transistor M10 is a transistor identical to the transistor M that is desired to bias at its exact threshold value. The circuits 11 and 12 are such that the voltage $V_P$ at the input of transistor M10 is very slightly higher than its threshold value. Thus, the output of the inverter 2 towards the transistor M will have the same value and the desired result will be obtained. At equilibrium:

$$V_P = V_T + I_{ds} * g_m$$

where $V_T$ is the gate threshold voltage of transistor M10 or transistor M, $g_m$ is the transconductance of the transistor M10 and $I_{ds}$ is the current in transistor M10.

If it is assumed that the threshold voltage $V_T$ of the transistor M10 (and therefore simultaneously that of the transistor M formed on the same integrated circuit) temporarily increases with respect to a balance value further to variations in parameters such as the temperature, a decrease of current in transistor M10 will occur. This will cause the biasing voltage on terminal 14 to increase, that is, the voltage $V_x$ at the connection point of transistors M3' and M4' will drop. This will cause a decrease of the output voltage of comparator 11 and therefore an increase of $V_P$. An increase of $V_P$ will tend to cause the biasing voltage on terminal 14 to decrease. This action of the biasing voltage counterbalances the influence of an increase of $V_T$. The same approach applies for the inverse case where $V_T$ tends to decrease. Thus, the biasing voltage is maintained balanced so that the output of inverter 13 is always slightly above the threshold voltage of a MOS transistor.

Referring to the circuit of FIG. 4, it is of course essential, for permitting it to operate, that the resistance of transistor M11 has a high value with respect to the resistance of transistor M10 at the neighbourhood of the conduction threshold. Said resistance at the neighbourhood of the conduction threshold being about a hundred ohms, a resistance M11 of about a hundred kilhoms will be chosen.

I claim:

1. A stabilized bias generator for supplying a biasing voltage to a threshold voltage circuit wherein the threshold circuit supplies a threshold voltage to a MOS transistor of an integrated circuit, said threshold voltage circuit including a first comparator (1) having first and second inputs for respectively receiving an input voltage and a reference voltage, and an output connected to a first inverter (2) said biasing voltage being equal to the threshold voltage of the MOS transistor (M) when input voltages applied to said first and second inputs of said first comparator (1) are substantially equal, said stabilized bias generator comprising:

- a second comparator (11) substantially equivalent to said first comparator (1) and having first and second inputs interconnected to receive a reference voltage;
- a second inverter (12) substantially equivalent to said first inverter (2) and connected to receive an output from said second comparator; and
- a third inverter (13) connected to receive an output from said second inverter (12) and an output (14) connected to supply said biasing voltage to said first and second comparators (1,11), said third inverter (13) having a threshold voltage substantially equal to the threshold voltage of the MOS transistor.

2. A stabilized bias generator according to claim 1, wherein the second comparator (11) includes two comparison MOS transistors (M3', M4'), the gates of which are interconnected and receive said reference voltage received at said second input of said first comparator (1) and the sources of which are grounded through a biasing transistor (M6') which receives on its gate said biasing voltage from the output (14) of the third inverter (13).

3. A stabilized bias generator according to claim 1, wherein the third inverter (13) comprises a depletion transistor (M11) in series with an enhancement transistor (M10), the enhancement transistor being substantially equivalent to the MOS transistor (M), the depletion transistor resistance having a high value at the ON-state with respect to the corresponding resistance value of the enhancement transistor when operated in the vicinity of its conduction threshold.

4. A stabilized bias generator according to claim 2, wherein the third inverter (13) comprises a depletion transistor (M11) in series with an enhancement transistor (M10), the enhancement transistor being substantially equivalent to the first comparator (1) MOS transistor (M), the depletion transistor resistance having a high value at the ON-state with respect to the corresponding resistance value of the enhancement transistor when operated in the vicinity of its conduction threshold.

5. A stabilized bias generator for supply a threshold voltage to a MOS transistor, comprising:

a first comparator (1) receiving a biasing voltage and including first and second inputs respectively receiving a variable voltage ($V_{in}$) and a reference voltage ($V_{REF}$):

a first inverter (2) receiving an output from said first comparator (1) and supplying said threshold voltage to said MOS transistor;

a second comparator (11) having first and second inputs interconnected to receive said reference voltage ($V_{REF}$);

a second inverter (12) connected to receive an output from said second comparator; and a third inverter (13) connected to receive an output from said second inverter (12) and an output (14) connected to supply said biasing voltage to said MOS transistor and to said first and second comparators (1, 11), said third inverter (13) having a threshold voltage substantially equal to the threshold voltage of the MOS transistor.

6. A stabilized bias generator according to claim 5, wherein the first and second comparators (1, 11) are matched to have substantially identical operating characteristics and wherein said first and second inverters (2, 12) are matched to have substantially identical operating characteristics.

7. A stabilized bias generator according to claim 5, wherein the second comparator (11) includes two comparison MOS transistors (M3', M4'), the gates of which are interconnected and receive a reference voltage and the sources of which are grounded through a biasing transistor (M6') which receives on its gate said biasing voltage from the output (14) of the second inverter (13).

8. A stabilized bias generator according to claim 5, wherein the third inverter (13) comprises a depletion transistor (M11) in series with an enhancement transistor (M10), the enhancement transistor being substantially equivalent the MOS transistor (M), the depletion transistor resistance having a high value at the ON-state with respect to the corresponding resistance value of the enhancement transistor when operated in the vicinity of its conduction threshold.

9. A stabilized bias generator for supplying a threshold voltage to a MOS transistor fabricated on a common integrated circuit device, comprising:

first and second matched comparators (1, 11), said first comparator (1) receiving a biasing voltage and including first and second inputs respectively receiving a variable voltage ($V_{in}$) and a reference voltage ($V_{REF}$) and said second comparator (11) having first and second inputs interconnected to receive said reference voltage ($V_{REF}$);

a first and second matched inverters (2, 12), said first inverter (2) receiving an output from said first comparator (1) and supplying said threshold voltage to said MOS transistor, said second inverter (12) connected to receive an output from said second comparator (11); and a third inverter (13) connected to receive an output from said second inverter (12) and an outlet (14) connected to supply said biasing voltage to said MOS transistor and to said first and second comparators (1, 11), said third inverter (13) having a threshold voltage substantially equal to the threshold voltage of the MOS transistor.

10. A stabilized bias generator according to claim 9, wherein the second comparator (11) includes two comparison MOS transistors (M3', M4'), the gates of which are interconnected and receive a reference voltage and the sources of which are grounded through a biasing transistor (M6') which receives on its gate said biasing voltage from the output (14) of the second inverter (13).

11. A stabilized bias generator according to claim 9, wherein the third inverter (13) comprises a depletion transistor (M11) in series with an enhancement transistor (M10), the enhancement transistor being substantially equivalent the MOS transistor (M), the depletion transistor resistance having a high value at the ON-state with respect to the corresponding resistance value of the enhancement transistor when operated in the vicinity of its conduction threshold.

12. A stabilized bias generator according to claim 11, wherein the second comparator (11) includes two comparison MOS transistors (M3', M4'), the gates of which are interconnected and receive a reference voltage and the sources of which are grounded through a biasing transistor (M6') which receives on its gate said biasing voltage from the output (14) of the second inverter (13).

* * * * *